(12) United States Patent
Chen et al.

(10) Patent No.: US 10,211,137 B2
(45) Date of Patent: Feb. 19, 2019

(54) SEMICONDUCTOR DEVICE PACKAGE

(71) Applicant: Advanced Semiconductor Engineering, Inc., Kaohsiung (TW)

(72) Inventors: Chien-Hua Chen, Kaohsiung (TW); Sheng-Chi Hsieh, Kaohsiung (TW); Cheng-Yuan Kung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/618,085

(22) Filed: Jun. 8, 2017

(65) Prior Publication Data
US 2018/0358291 A1  Dec. 13, 2018

(51) Int. Cl.
*H01L 23/04* (2006.01)
*H01L 23/498* (2006.01)
*H05K 1/16* (2006.01)
*H01L 21/48* (2006.01)
*H01L 23/538* (2006.01)

(52) U.S. Cl.
CPC ...... *H01L 23/49827* (2013.01); *H01L 21/486* (2013.01); *H01L 21/4853* (2013.01); *H01L 23/49816* (2013.01); *H01L 23/49838* (2013.01); *H01L 23/49894* (2013.01); *H01L 23/5389* (2013.01); *H05K 1/162* (2013.01)

(58) Field of Classification Search
CPC ............... H01L 21/4853; H01L 21/486; H01L 23/49816; H01L 23/49827; H01L 23/49838; H01L 23/49894; H01L 23/5389; H01L 24/18; H01L 24/27; H01L 24/29; H01L 24/82; H01L 24/83; H01L 25/0657
USPC ................................. 257/684, 686, 690, 698
See application file for complete search history.

(56) References Cited

U.S. PATENT DOCUMENTS

| | | | | |
|---|---|---|---|---|
| RE43,380 E | * | 5/2012 | Wakisaka | H01L 23/5389 257/684 |
| 2001/0010627 A1 | * | 8/2001 | Akagawa | H01L 23/3121 361/761 |
| 2011/0147055 A1 | * | 6/2011 | Ma | H01L 21/4803 174/255 |

* cited by examiner

*Primary Examiner* — Brook Kebede
(74) *Attorney, Agent, or Firm* — Foley & Lardner LLP; Cliff Z. Liu

(57) ABSTRACT

A method for manufacturing a semiconductor device package includes providing a substrate having a first surface and a second surface opposite to the first surface; disposing a passive component layer on the first surface of the substrate; after disposing the passive component layer, forming at least one via in the substrate, wherein the via penetrates the substrate and the passive component layer; and disposing a conductive layer on the passive component layer and filling the via with the conductive layer.

18 Claims, 14 Drawing Sheets

SEMICONDUCTOR DEVICE PACKAGE

BACKGROUND

1. Technical Field

The present disclosure relates to a semiconductor device package and a method of manufacturing the same. In particular, the present disclosure relates to a semiconductor device package including a through glass via (TGV) for electrical interconnection.

2. Description of the Related Art

An integrated passive device (IPD) of a semiconductor device package may include a through glass via (TGV) for electrical interconnection. A drill technique is used to form a TGV in a relatively thick (e.g., greater than about 300 micrometers (μm)) glass substrate. A support/protection film (e.g., Ajinomoto Build-up Film (ABF)) may be used to handle a relatively thin (e.g., less than about 300 μm) glass substrate. In such cases, ABF film may be applied to both sides of the glass substrate and the drilling operation may be twice performed on the substrate to form the TGV. However, the drilling operation may damage the glass substrate, especially a relatively thin glass substrate. Moreover, planarity of the ABF is not good enough and may adversely affect the subsequent process (e.g., process of forming capacitors).

SUMMARY

In one or more embodiments, a method for manufacturing a semiconductor device package includes providing a substrate having a first surface and a second surface opposite to the first surface; disposing a passive component layer on the first surface of the substrate; after disposing the passive component layer, forming at least one via in the substrate, wherein the via penetrates the substrate and the passive component layer; and disposing a conductive layer on the passive component layer and filling the via with the conductive layer.

In one or more embodiments, a method for manufacturing a semiconductor device package includes providing a substrate having a first surface and a second surface opposite to the first surface, wherein the substrate includes a connecting portion region and at least one passive component region for disposing passive components; disposing a passive component layer on the first surface of the substrate at the passive component region, wherein the passive component layer includes a plurality of passive components; forming at least one via at the connecting portion region, wherein the via penetrates the passive component layer and the first surface of the substrate; and disposing a conductive layer on the passive component layer, wherein the conductive layer is electrically connected to at least one of the plurality of passive components, and the conductive layer extends into the via from the passive component layer.

In one or more embodiments, a semiconductor device package includes a substrate, a first patterned conductive layer, a first insulation layer and a second patterned conductive layer. The substrate has a first sidewall, a first surface and a second surface opposite to the first surface. The first patterned conductive layer is on the first surface of the substrate and has a second sidewall, a first surface and a second surface. The second surface is adjacent to the substrate and opposite to the first surface of the first patterned conductive layer. The first insulation layer is on the first surface of the substrate and has a third sidewall. The first insulation layer has a first surface and a second surface adjacent to the substrate and opposite to the first surface of the first insulation layer. The second patterned conductive layer extends from the first surface of the first insulation layer to the second surface of the substrate via the first insulation layer and the second patterned conductive layer. The second patterned conductive layer covers the first, second and third sidewalls.

BRIEF DESCRIPTION OF THE DRAWINGS

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Described in this disclosure are techniques for providing devices with reduced package sizes. In particular, the present disclosure relates to a semiconductor device package structure including an improved through glass via (TGV) structure for electrical interconnection.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such arrangement.

Figure 1:
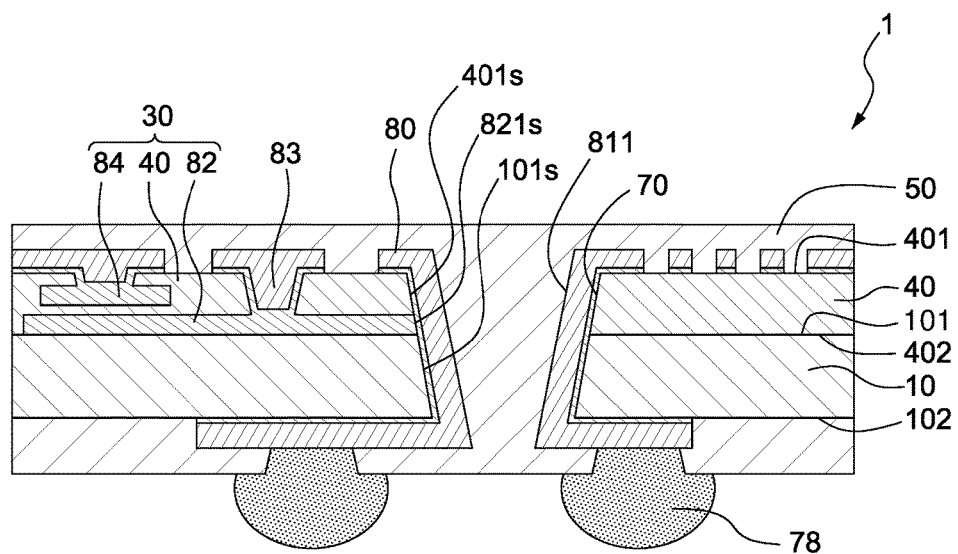
FIG. 1 is a cross-sectional view of a semiconductor device package in accordance with some embodiments of the present disclosure.

FIG. 1 is a cross-sectional view of a semiconductor device package 1 in accordance with some embodiments of the present disclosure. The semiconductor device package 1 includes a substrate 10, a passive component layer 30, insulation layers 40 and 50, interconnection structures 83, conductive connects 78, and patterned conductive layers 80, 82 and 84. The insulation layer 40 may be a passivation layer 40 that is also additionally a support layer. The semiconductor device package 1 shown in FIG. 1 is a portion of example units prior to singulation or cutting, and the whole substrate includes a plurality of such units before cutting.

In one or more embodiments, the substrate 10 includes glass, silicon, silicon dioxide (SiO$_2$), or a combination thereof. In one or more embodiments, a thickness of the substrate 10 is in a range of about 100 micrometers (μm) to about 200 μm. In one or more embodiments, a thickness of the substrate 10 is less than about 300 μm. In some embodiments, the substrate 10 is a glass substrate and a surface roughness of the glass substrate is less than about 1 μm, such as about 900 nanometers (nm) or less or about 800 nm or less in terms of root-mean-square surface roughness, due to a manufacturing process in accordance with some embodiments. The substrate 10 has a sidewall 101s. The substrate 10 has a top surface 101 and a surface 102 opposite to the surface 101.

In one or more embodiments, the substrate 10 may include one or more active components (e.g., ICs) embedded in the substrate 10, and/or one or more active components disposed on the substrate 10. In one or more embodiments, the substrate 10 may include one or more passive components (e.g., the passive component layer 30 as shown in FIG. 1) disposed on the substrate 10. The patterned conductive layers 82 and 84, together with the insulation layer 40, form the passive component layer 30. The passive component layer 30 may be a capacitor 30. The passive component layer 30 is connected to the patterned conductive layer 80 through the interconnection structure 83. The patterned conductive layers 82 and 84 may include, for example, copper (Cu), or other metal, or a metal alloy, or other conductive material. The patterned conductive layers 82 and 84 may include a seed layer to allow for plating during the formation of the patterned conductive layers 82 and 84; or the patterned conductive layers 82 and 84 are a structure for metal-insulator-metal (MIM). The patterned conductive layers 82 and 84 may be processed by a sputter process.

The insulation layer 40 is disposed on a portion of the surface 101 of the substrate 10. The insulation layer 40 includes a top surface 401 and a surface 402 adjacent to the substrate 10 and opposite to the top surface 401. The insulation layer 40 has a sidewall 401s. In some embodiments, the insulation layer 40 includes a suitable insulating material. For example, the insulation layer 40 may be a silicon nitride (SiN$_x$) film; however, other suitable materials may be additionally or alternatively used. In one or more embodiments, a thickness of the insulation layer 40 is in a range of about 8 μm to about 10 μm. The patterned conductive layer 80 covers the top surface 401 of the insulation layer 40 and the surface 102 of the substrate 10. The patterned conductive layer 82 has a sidewall 821s. The patterned conductive layer 80 is extended from the surface 401 of the insulation layer 40 to the surface 102 of the substrate 10 via the insulation layer 40, the patterned conductive layer 82 and the substrate 10. The patterned conductive layer 80 covers the sidewalls 101s, 401s, and 821s. The patterned conductive layer 80 on both sides of the substrate 10 can be formed by one-time plating, and the process can be simplified. The patterned conductive layer 80 is filled within a via 70. The patterned conductive layer 80 defines a via 811. The patterned conductive layer 80 and interconnection structures 83 may include, for example, Cu, or other metal, or a metal alloy, or other conductive material. The patterned conductive layer 80 and interconnection structures 83 may include a seed layer to allow for plating during the formation of the patterned conductive layer 80 and interconnection structures 83.

The insulation layer 50 penetrates the substrate 10, the insulation layer 40 and the patterned conductive layer 82. The insulation layer 50 covers the patterned conductive layer 80, a portion of the top surface 401 of the insulation layer 40 and a portion of the surface 102 of the substrate 10. In some embodiments, a material of the insulation layer 50 may be different from a material of the insulation layer 40. The insulation layer 50 may be Ajinomoto Build-up Film (ABF); however, other suitable materials may be additionally or alternatively used. In some embodiments, the ABF on the top surface 101 of the substrate 10 may be eliminated to facilitate the formation of an integrated passive device (IPD) (e.g., for better planarity).

The conductive connects 78 are connected to the patterned conductive layer 80. The conductive connects 78 may be solder balls. The insulation layer 50 is filled into the via 811. The insulation layer 50 is surrounded by the patterned conductive layer 80. The via 70 penetrates the substrate 10, the insulation layer 40 and patterned conductive layer 82. In some embodiments, the via 70 is formed by a sand-blasting technique, rather than a drilling technique. Damage of the relatively thin (e.g., glass) substrate 10 can be avoided during the manufacturing process by replacing the drilling technique with the sand-blasting technique.

Figure 2:
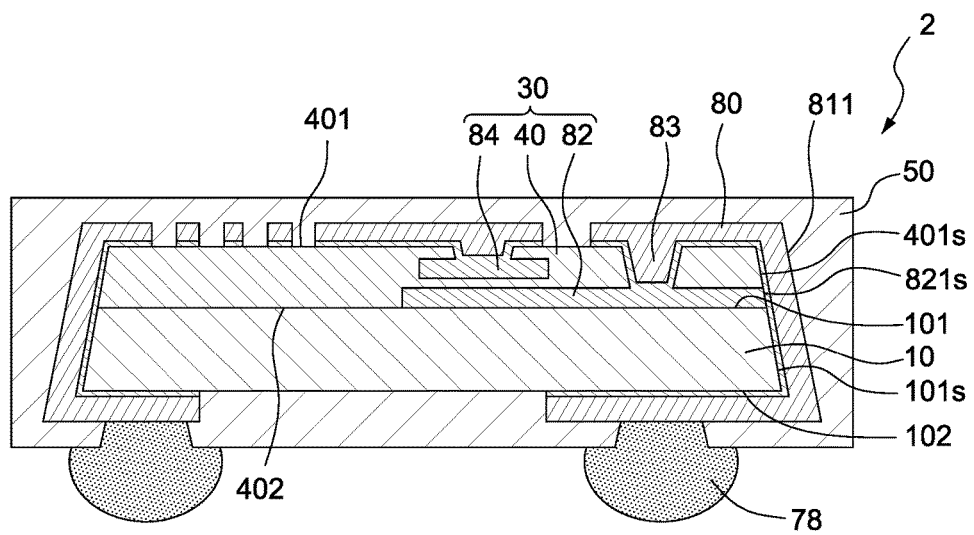
FIG. 2 is a cross-sectional view of a semiconductor device package in accordance with some embodiments of the present disclosure.

FIG. 2 is a cross-sectional view of a semiconductor device package 2 in accordance with some embodiments of the present disclosure. The semiconductor device package 2 is similar to the semiconductor device package 1 of FIG. 1, and same-numbered components are not described again with respect to FIG. 2. The semiconductor device package 2 shown in FIG. 2 is an example unit after singulation or cutting, and the whole substrate includes a plurality of such units before cutting.

The semiconductor device package 2 includes a substrate 10, a passive component layer 30, insulation layers 40 and 50, interconnection structures 83, conductive connects 78, and patterned conductive layers 80, 82 and 84. The insulation layer 40 may be a passivation layer 40 that is also additionally a support layer. In one or more embodiments, the substrate 10 includes glass, silicon, SiO$_2$, or a combination thereof. In one or more embodiments, a thickness of the substrate 10 is in a range of about 100 μm to about 200 In one or more embodiments, a thickness of the substrate 10 is less than about 300 In some embodiments, the substrate 10 is a glass substrate and a surface roughness of the glass substrate is less than about 1 such as about 900 nm or less or about 800 nm or less in terms of root-mean-square surface roughness, due to a manufacturing process in accordance with some embodiments. The substrate 10 has a sidewall 101s. The substrate 10 has a top surface 101 and a surface 102 opposite to the surface 101. The substrate 10 has a sidewall 101s.

The patterned conductive layers 82 and 84, together with the insulation layer 40, form the passive component layer 30. The patterned conductive layer 80 is electrically connected to the patterned conductive layer 82. The patterned conductive layer 80 is also electrically connected to the patterned conductive layer 82 through the interconnection structure 83. The patterned conductive layers 80, 82 and 84 may include, for example, Cu, or other metal, or a metal alloy, or other conductive material. The patterned conductive layers 80, 82 and 84 may include a seed layer to allow for plating during the formation of the patterned conductive layers 80, 82 and 84; or the patterned conductive layers 82 and 84 are a structure for MIM. The patterned conductive layers 82 and 84 may be processed by a sputter process. The patterned conductive layer 82 has a sidewall 821s. The patterned conductive layer 80 covers the sidewalls 101s, 401s, and 821s. The interconnection structures 83 may include a seed layer to allow for plating during the formation of the interconnection structures 83.

The insulation layer 50 encapsulates the substrate 10, the insulation layer 40, the patterned conductive layer 80 and the patterned conductive layer 82. The insulation layer 50 also covers the patterned conductive layer 80, a portion of the top surface 401 of the insulation layer 40 and a portion of the surface 102 of the substrate 10. In some embodiments, a material of the insulation layer 50 may be different from a material of the insulation layer 40. The insulation layer 50 may be ABF; however, other suitable materials may be additionally or alternatively used. The conductive connects 78 are connected to the patterned conductive layer 80. The conductive connects 78 may be solder balls.

Figure 3:
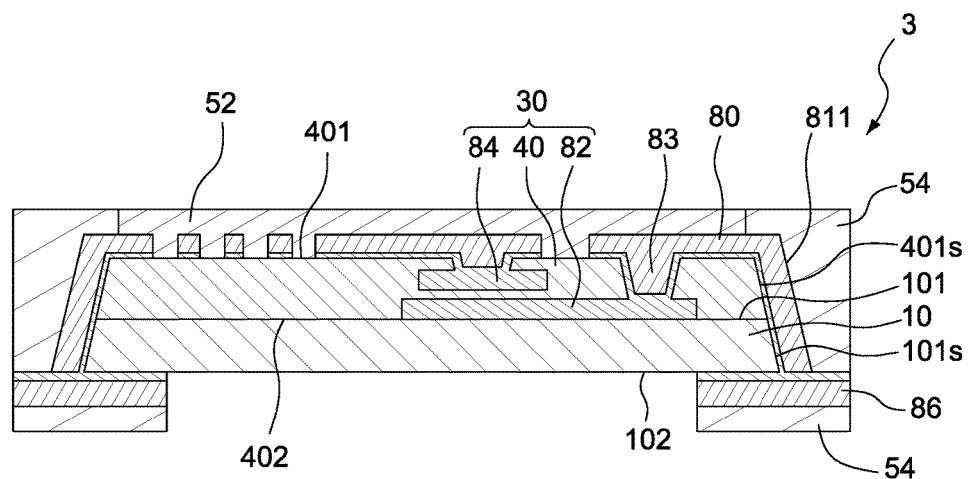
FIG. 3 is a cross-sectional view of a semiconductor device package in accordance with some embodiments of the present disclosure.

FIG. 3 is a cross-sectional view of a semiconductor device package 3 in accordance with some embodiments of the present disclosure. The semiconductor device package 3 is similar to the semiconductor device package 2 of FIG. 2, and same-numbered components are not described again with respect to FIG. 3. The semiconductor device package 3 shown in FIG. 2 is an example unit after singulation or cutting, and the whole substrate includes a plurality of such units before cutting.

The semiconductor device package 3 includes a substrate 10, a passive component layer 30, insulation layers 40, 52 and 54, interconnection structures 83, patterned conductive layers 80, 82 and 84 and a support structure 86. The insulation layer 40 may be a passivation layer 40 that is additionally a support layer.

In one or more embodiments, the substrate 10 includes glass, silicon, $SiO_2$, or a combination thereof. In one or more embodiments, a thickness of the substrate 10 is in a range of about 100 μm to about 200 μm. In one or more embodiments, a thickness of the substrate 10 is less than about 300 μm. In some embodiments, the substrate 10 is a glass substrate and a surface roughness of the glass substrate is less than about 1 μm, such as about 900 nm or less or about 800 nm or less in terms of root-mean-square surface roughness, due to a manufacturing process in accordance with some embodiments. The substrate 10 has a top surface 101 and a surface 102 opposite to the surface 101. The substrate 10 has a sidewall 101s.

In one or more embodiments, the substrate 10 may include one or more active components (e.g., ICs) embedded in the substrate 10, and/or one or more active components disposed on the substrate 10. In one or more embodiments, the substrate 10 may include one or more passive components (e.g., the passive component layer 30 as shown in FIG. 1) disposed on the substrate 10. The patterned conductive layers 82 and 84, together with the insulation layer 40, form the passive component layer 30. The passive component layer 30 may be a capacitor 30. The passive component layer 30 is connected to the patterned conductive layer 80 through the interconnection structure 83. In some embodiments, the passive component layer 30 may be connected to the patterned conductive layer 80 through one end of the interconnection structure 83. The patterned conductive layers 80, 82 and 84 may include, for example, Cu, or other metal, or a metal alloy, or other conductive material. The patterned conductive layers 80, 82 and 84 may include a seed layer to allow for plating during the formation of the patterned conductive layers 80, 82 and 84; or the patterned conductive layers 82 and 84 are a structure for MIM. The patterned conductive layers 82 and 84 may be processed by a sputter process.

The insulation layer 40 is disposed on a portion of the surface 101 of the substrate 10. The insulation layer 40 includes a top surface 401 and a surface 402 adjacent to the substrate 10 and opposite to the top surface 401. The insulation layer 40 has a sidewall 401s. In some embodiments, the insulation layer 40 includes a suitable insulating material. For example, the insulation layer 40 may be an $SiN_x$ film; however, other suitable materials may be additionally or alternatively used. In one or more embodiments, a thickness of the insulation layer 40 is in a range of about 8 μm to about 10 The patterned conductive layer 80 covers the top surface 401 of the insulation layer 40 and the surface 102 of the substrate 10. For example, a seed layer covering the surface 102 of the substrate 10 may be considered a portion of the patterned conductive layer 80. The patterned conductive layer 80 is extended from the surface 401 of the insulation layer 40 to the surface 102 of the substrate 10 via the insulation layer 40 and the substrate 10. The patterned conductive layer 80 covers the sidewalls 101s and 401s. The patterned conductive layer 80 on both sides of the substrate 10 can be formed by one-time plating, and the process can be simplified.

The interconnection structures 83 may include, for example, Cu, or other metal, or a metal alloy, or other conductive material. The interconnection structures 83 may include a seed layer to allow for plating during the formation of the interconnection structures 83.

The insulation layer 52 covers a portion of the patterned conductive layer 80 and a portion of the top surface 401 of the insulation layer 40. The insulation layer 54 covers a portion of the patterned conductive layer 80 and a portion of the support structure 86. In some embodiments, the insulation layer 52 may be a polypropylene resin; however, other suitable materials may be additionally or alternatively used. In some embodiments, the insulation layer 54 may be an epoxy resin or any other insulating material used additionally or alternatively. In some embodiments, a material of the insulation layer 54 may be the same material used for a solder mask. The support structure 86 may include, for example, Cu, or other metal, or a metal alloy, or other conductive material. The support structure 86 may include a seed layer to allow for plating during the formation of the support structure 86.

Figure 4A:
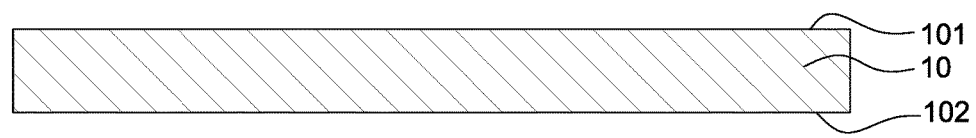
FIG. 4A, FIG. 4B, FIG. 4C, FIG. 4D, FIG. 4E, FIG. 4F, FIG. 4G, FIG. 4H, FIG. 4I, and FIG. 4J illustrate a method of manufacturing the semiconductor device package of FIG. 2 in accordance with some embodiments of the present disclosure.

FIGS. 4A-4J illustrate a method of manufacturing the semiconductor device package 2 of FIG. 2 in accordance with some embodiments of the present disclosure. Referring to FIG. 4A, a substrate 10 is provided. The substrate 10 has a top surface 101 and a surface 102 opposite to the surface 101. The substrate 10 originally provided may be a glass substrate without through holes. The substrate 10 includes glass, silicon, $SiO_2$, or a combination thereof. In some embodiments, the substrate 10 is formed of a glass material and a thickness of the substrate 10 is less than about 300 μm.

Figure 4B:
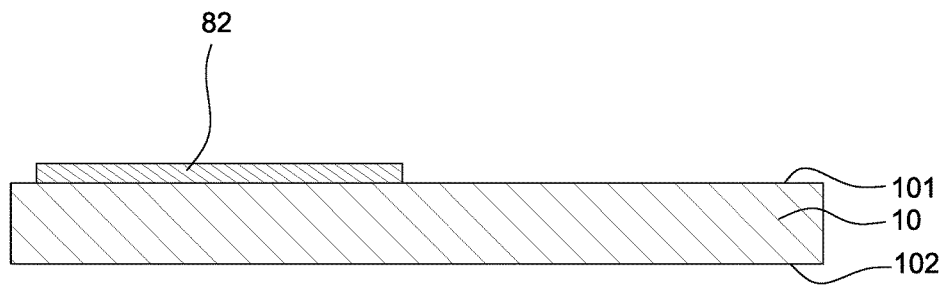

Referring to FIG. 4B, a patterned conductive layer 82 is disposed on the top surface 101 of the substrate 10.

Figure 4C:
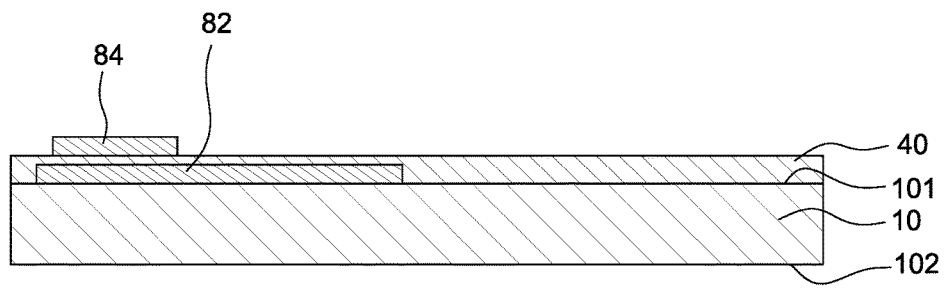

Referring to FIG. 4C, a first layer of an insulation layer 40 is disposed on the surface 101 of the substrate 10. For example, a material of the insulation layer 40 may be an $SiN_x$ film; however, other suitable materials may be additionally or alternatively used. A patterned conductive layer 84 is disposed on the first layer of the insulation layer 40. The patterned conductive layers 82 and 84, together with the insulation layer 40, form a passive component layer 30. The passive component layer 30 may be a capacitor 30.

The passive component layer 30 is directly formed on the surface 101 of the substrate 10. The patterned conductive layers 82 and 84 may include, for example, Cu, or other metal, or a metal alloy, or other conductive material. The patterned conductive layers 82 and 84 may include a seed layer to allow for plating during the formation of the patterned conductive layers 82 and 84; or the patterned conductive layers 82 and 84 are a structure for MIM. The patterned conductive layers 82 and 84 may be processed by a sputter process. In some embodiments, forming a via 70 further includes removing a portion of the passive component layer 30 and at least a portion of the substrate 10 simultaneously.

Figure 4D:
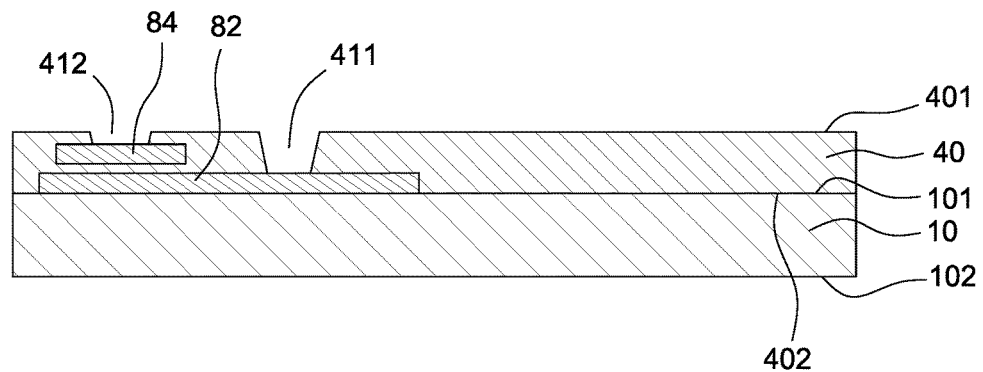

Referring to FIG. 4D, a second layer of the insulation layer 40 is disposed on the first layer of the insulation layer 40. Vias 411 and 412 are formed within the insulation layer 40. In some embodiments, the insulation layer 40 includes a suitable insulating material. For example, the insulation layer 40 may be an $SiN_x$ film; however, other suitable materials may be additionally or alternatively used.

Figure 4E:
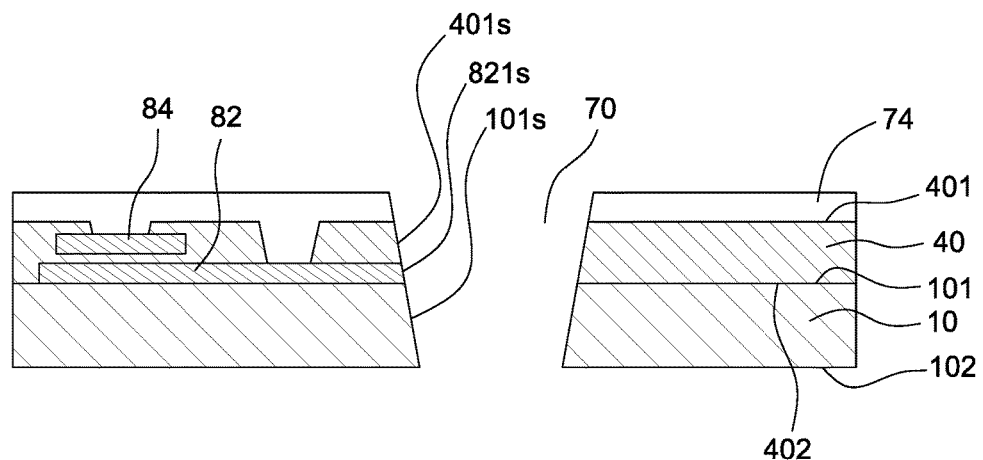

Referring to FIG. 4E, in some embodiments, a patterned photoresist layer 74 is disposed on a portion of the surface 401 of the insulation layer 40. The patterned photoresist layer 74 is used to form the via 70. In some embodiments, the patterned photoresist layer 74 may include, or may be formed from, a positive photoresist. In some embodiments, a portion of the substrate 10, the insulation layer 40 and the patterned conductive layer 82 are removed by a sand-blasting technique to form the via 70. The via 70 penetrates the substrate 10, the insulation layer 40 and the patterned conductive layer 82. In some embodiments, the via 70 is formed by the sand-blasting technique, rather than a drilling technique. Damage of the relatively thin (e.g., glass) substrate 10 can be avoided during a manufacturing process by replacing the drilling technique with the sand-blasting technique. The via 70 defines the sidewall 101s of the substrate 10, sidewall 401s of the insulation layer 40, and the sidewall 821s of the patterned conductive layer 82. The via (e.g., TGV) 70 is formed subsequent to the formation of the IPD (such as the passive component layer 30) to improve the process since one-time drilling or sand-blasting is used. It is also contemplated that a portion of the substrate 10 may be removed after disposing the passive component layer 30 and before forming the via 70, so as to thin the substrate 10.

Figure 4F:
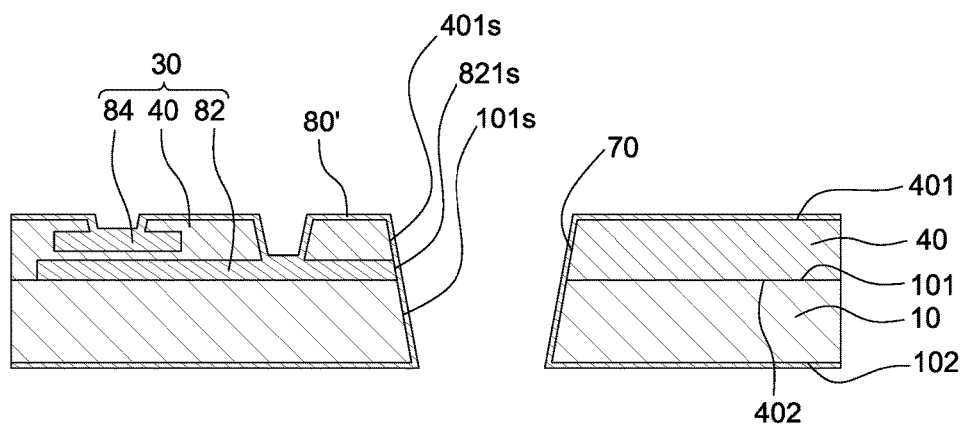

Referring to FIG. 4F, a patterned conductive layer 80' is disposed to cover the exposed patterned conductive layer 82. The patterned conductive layer 80' is disposed to cover the sidewall 101s of the substrate 10, sidewall 401s of the insulation layer 40, and sidewall 821s of the patterned conductive layer 82. The patterned conductive layer 80' also covers a portion of the surface 401 of the insulation layer 40 and the surface 102 of the substrate 10. The conductive structure (such as patterned conductive layer 80') on both sides of the substrate 10 can be formed by one-time plating, and the process can be simplified. In some embodiments, the patterned conductive layer 80' may include, for example, titanium-copper (Ti—Cu) alloy or another suitable metal or metal alloy, or a combination thereof.

Figure 4G:
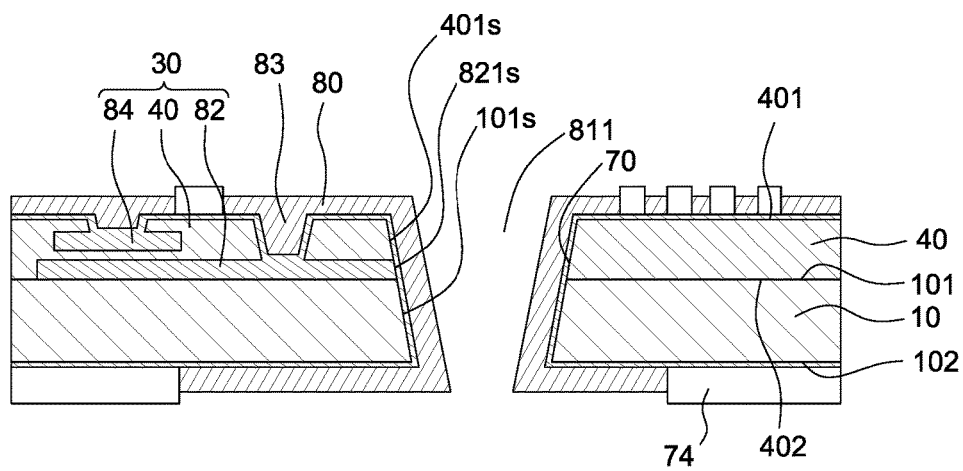

Referring to FIG. 4G, a portion of the patterned conductive layer 80' is removed. Another patterned photoresist layer 74 is disposed on regions in which the portion of the patterned conductive layer 80' is removed. In some embodiments, the patterned photoresist layer 74 may include, or may be formed from, a positive photoresist. A thickness of the patterned conductive layer 80' is increased by plating. After plating, the patterned conductive layer 80 is obtained. The patterned conductive layer 80 defines a via 811. The patterned conductive layer 80 may include, for example, Cu, or other metal, or a metal alloy, or other conductive material. The patterned conductive layer 80 covers the top surface 401 of the insulation layer 40.

Figure 4H:
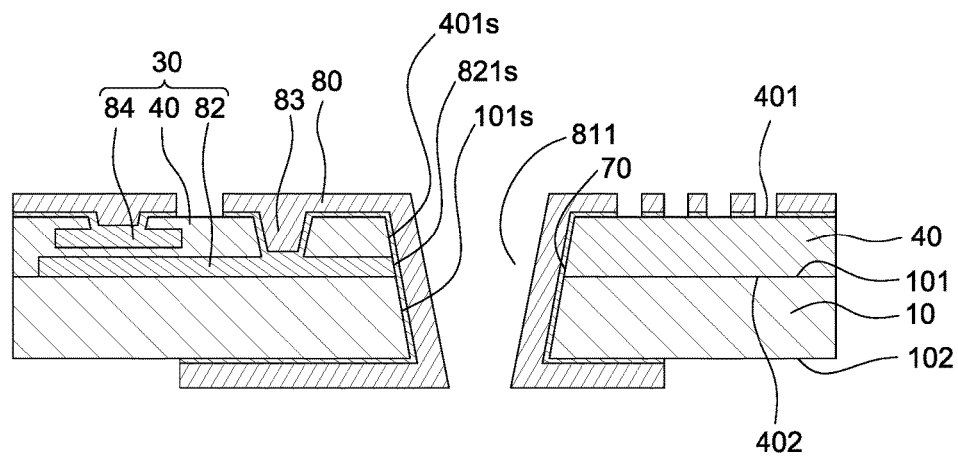
Figure 4I:
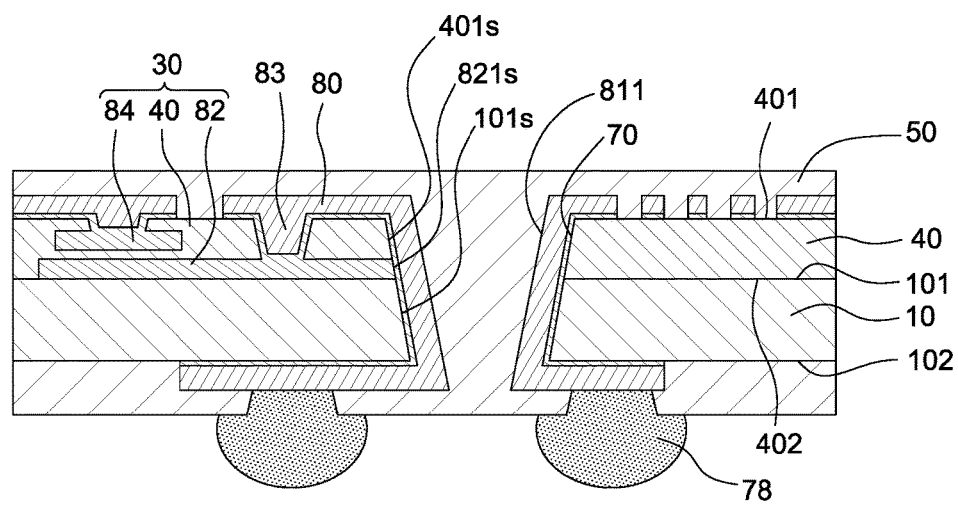

Referring to FIG. 4H, the patterned photoresist layer 74 is removed, for example, by etching. Referring to FIG. 4I, the insulation layer 50 is disposed to cover the patterned conductive layer 80, a portion of the top surface 401 of the insulation layer 40 and a portion of the surface 102 of the substrate 10. The insulation layer 50 is filled within the through hole 811. The insulation layer 50 may be ABF; however, other suitable materials may be additionally or alternatively used. Conductive connects 78 are disposed to be connected to the patterned conductive layer 80.

Figure 4J:
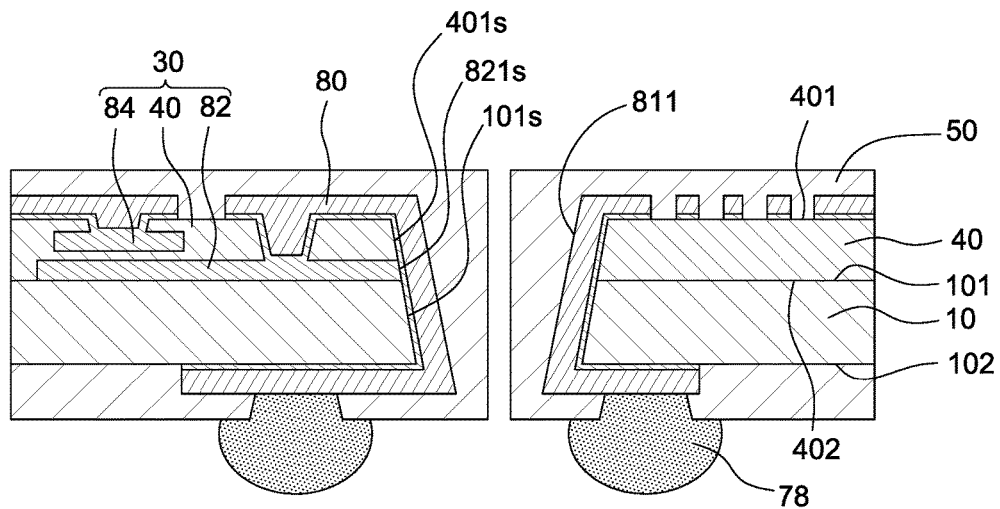

Referring to FIG. 4J, the semiconductor device package is separated along the cutting line, for example, by sawing. Next, the semiconductor device package 2 of FIG. 2 is obtained.

Figure 5A:
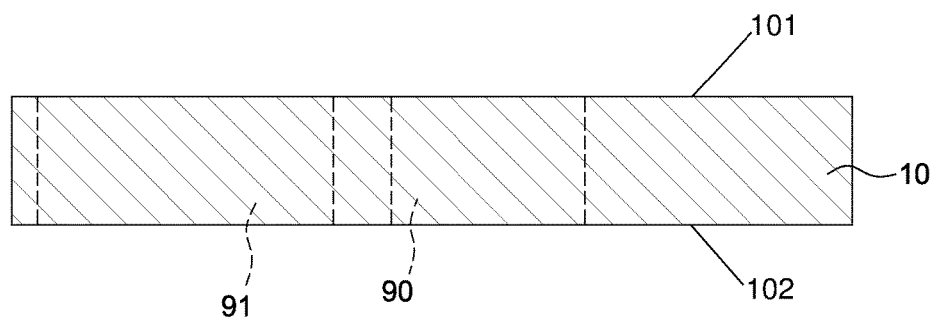
FIG. 5A, FIG. 5B, FIG. 5C, FIG. 5D, FIG. 5E, FIG. 5F, FIG. 5G, FIG. 5H, FIG. 5I, FIG. 5J, FIG. 5K, FIG. 5L, FIG. 5M, and FIG. 5N illustrate a method of manufacturing the semiconductor device package of FIG. 3 in accordance with some embodiments of the present disclosure.
Figure 5B:
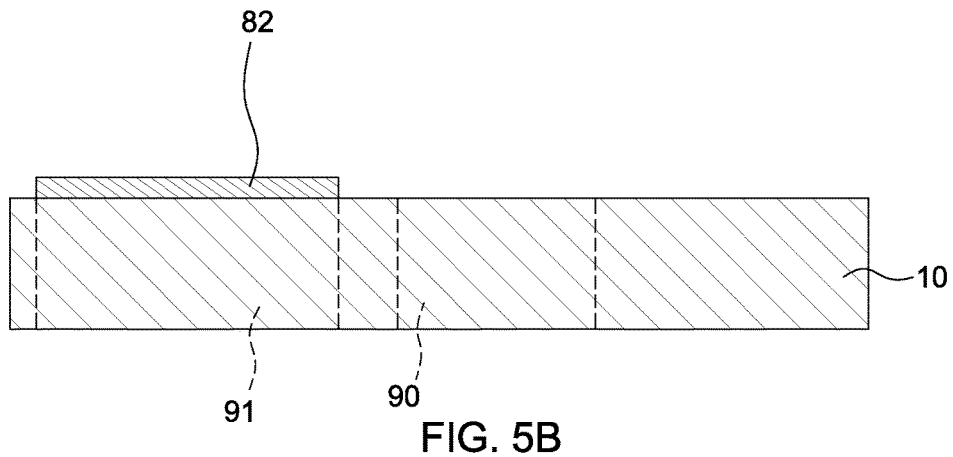
Figure 5C:
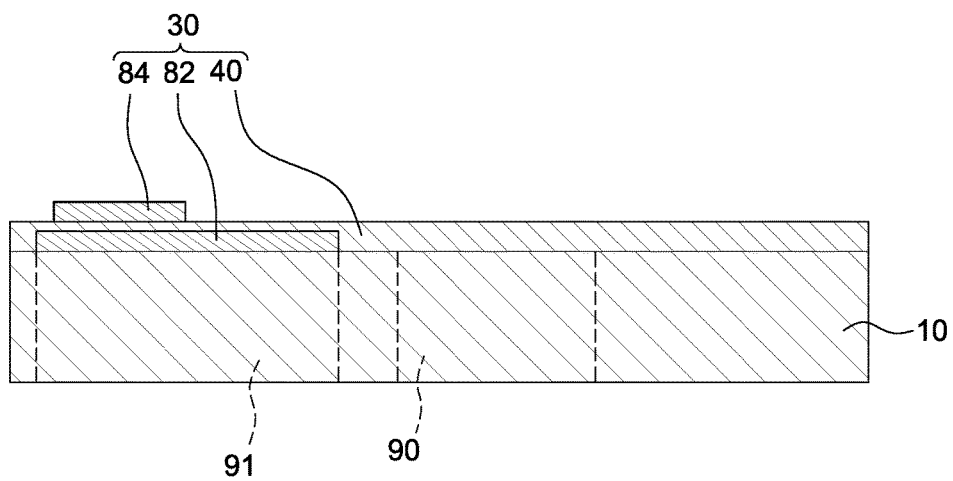
Figure 5D:
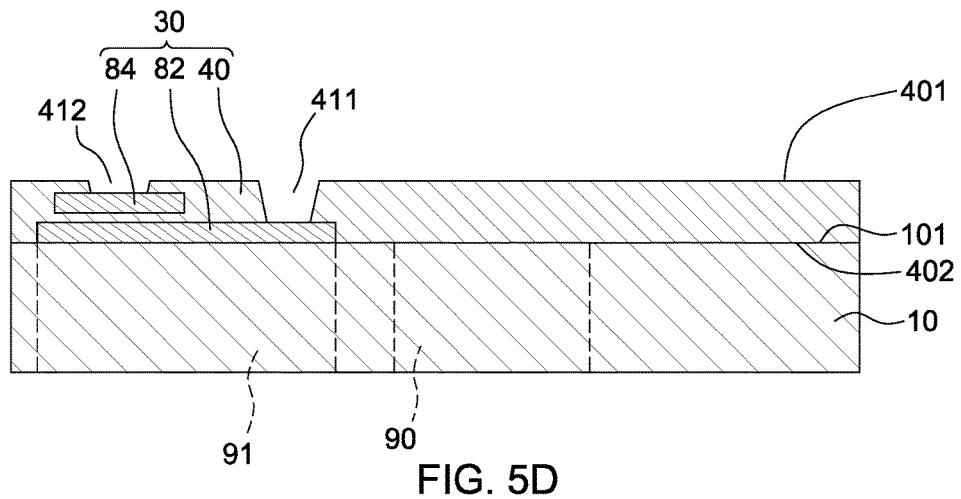
Figure 5E:
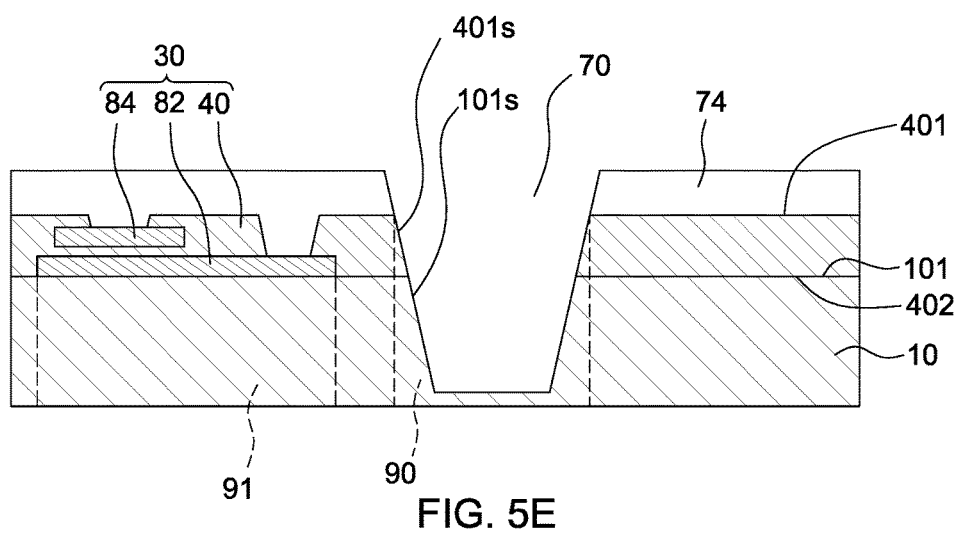
Figure 5F:
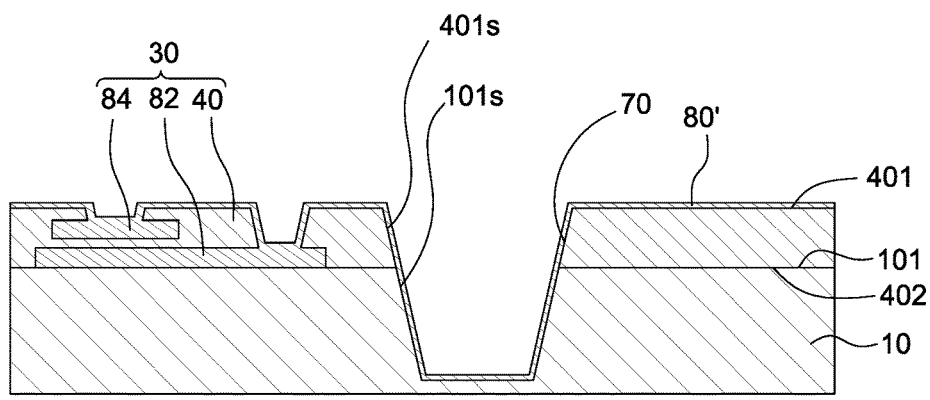
Figure 5G:
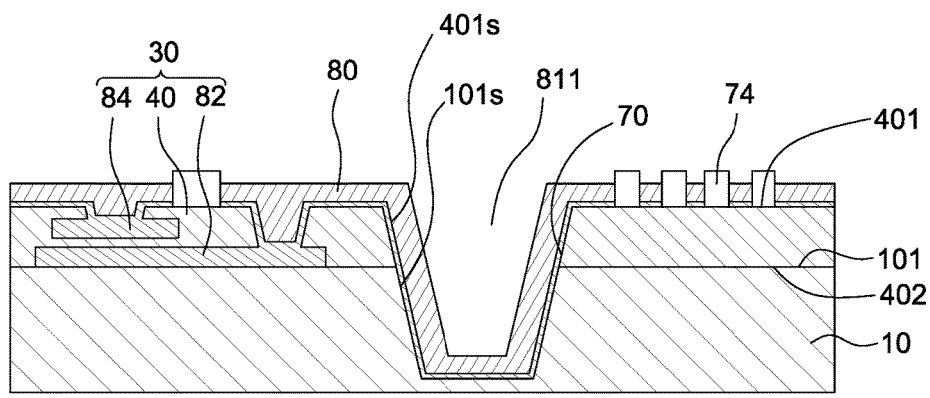
Figure 5H:
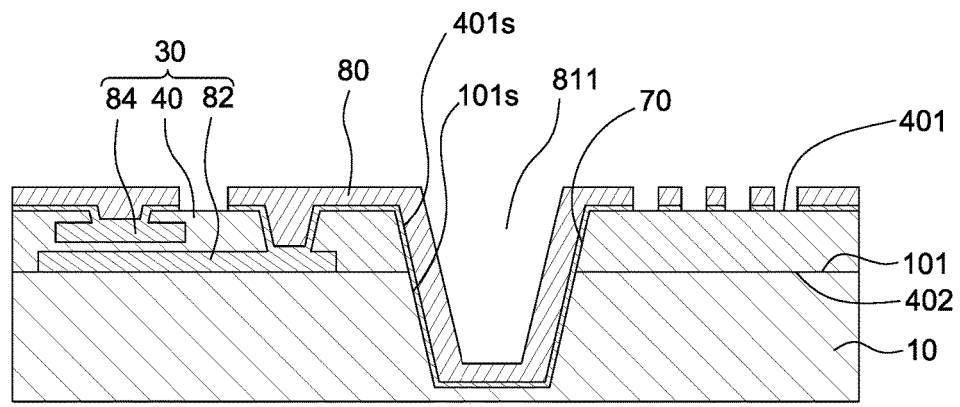
Figure 5I:
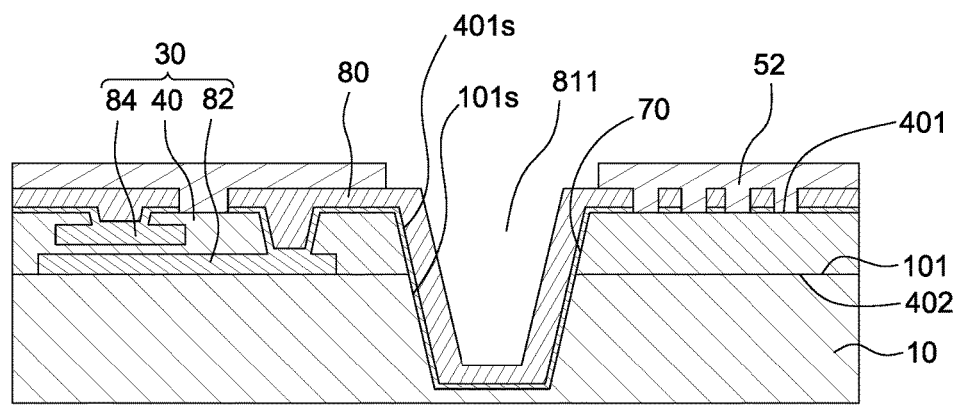
Figure 5J:
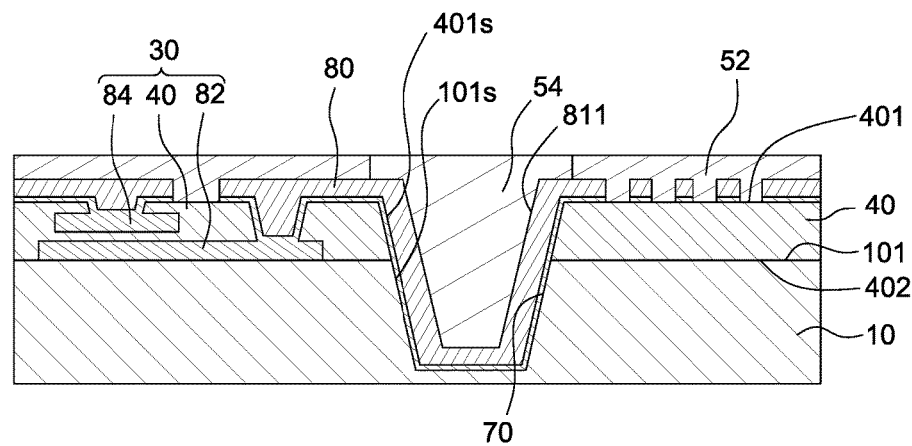
Figure 5K:
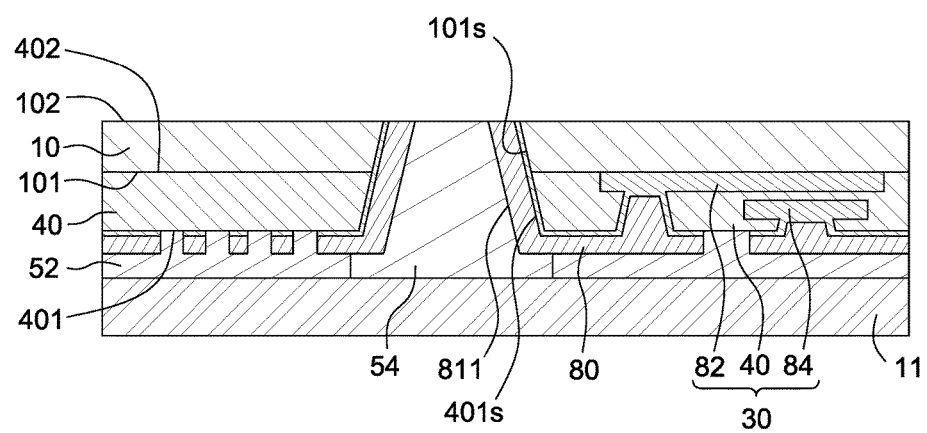
Figure 5L:
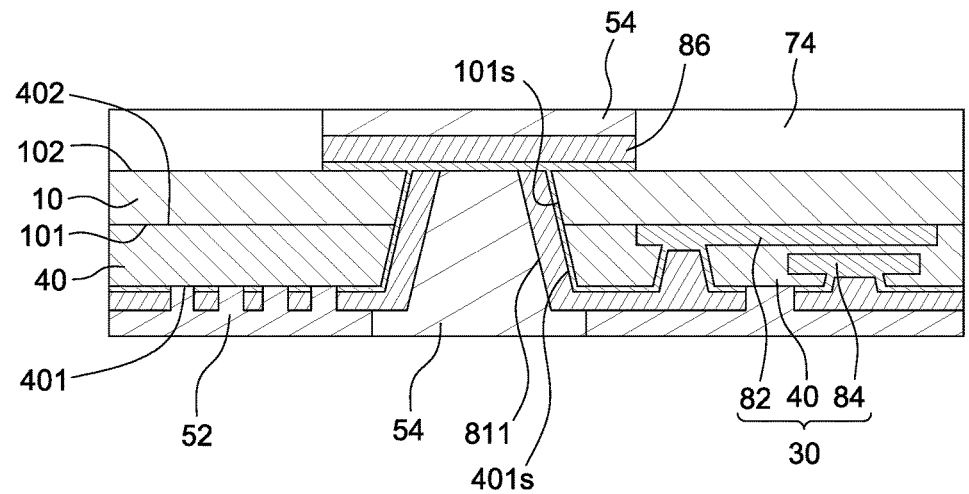
Figure 5M:
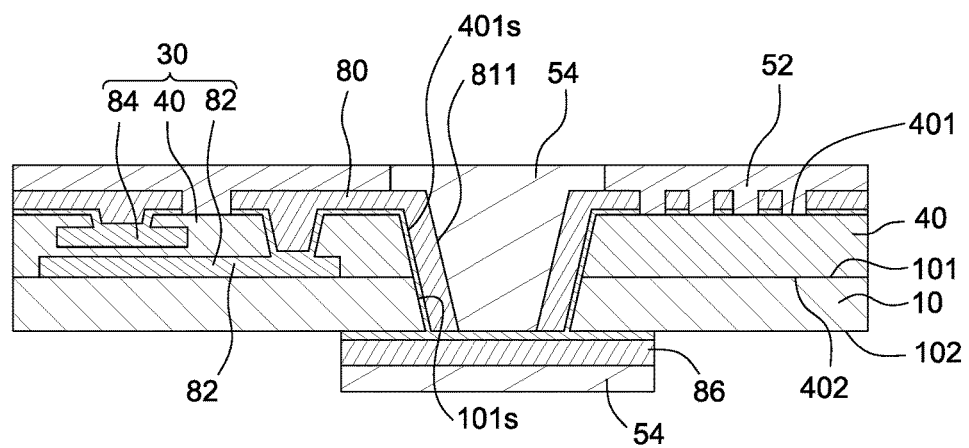
Figure 5N:
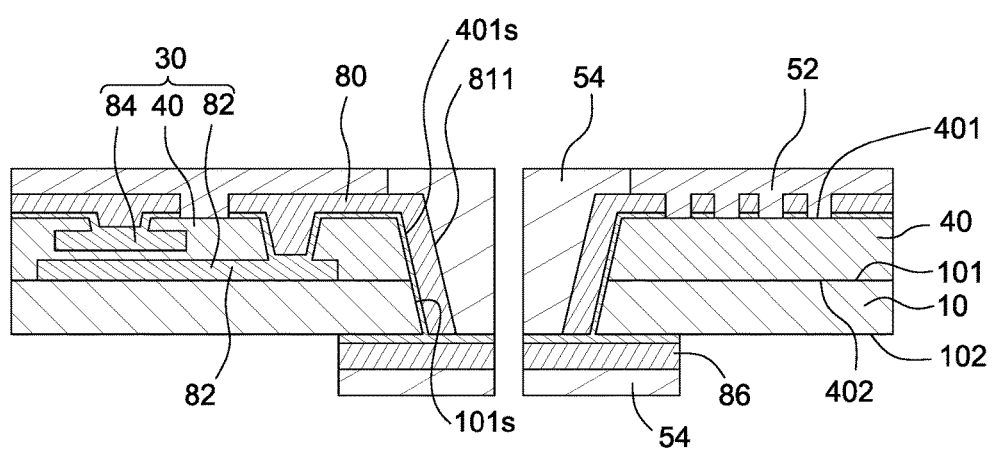

FIGS. 5A-5N illustrate a method of manufacturing the semiconductor device package 3 of FIG. 3 in accordance with some embodiments. Referring to FIG. 5A, a substrate 10 is provided. The substrate 10 originally provided may be a glass substrate without through holes. The substrate 10 has a top surface 101 and a surface 102 opposite to the surface 101. The substrate 10 includes glass, silicon, $SiO_2$, or a combination thereof. In some embodiments, the substrate 10 is formed of a glass material and a thickness of the substrate 10 is less than about 300 μm. The substrate 10 includes a connecting portion region 90 and at least one passive component region 91 for disposing passive components.

Referring to FIG. 5B, a patterned conductive layer 82 is disposed on the top surface 101 of the substrate 10.

Referring to FIG. 5C, a first layer of an insulation layer 40 is disposed on the surface 101 of the substrate 10. For example, a material of the insulation layer 40 may be an $SiN_x$ film; however, other suitable materials may be additionally or alternatively used. A patterned conductive layer 84 is disposed on the first layer of the insulation layer 40. The patterned conductive layers 82 and 84, together with the insulation layer 40, form a passive component layer 30. The passive component layer 30 may be a capacitor 30. The patterned conductive layers 82 and 84 may include, for example, Cu, or other metal, or a metal alloy, or other conductive material. The patterned conductive layers 82 and 84 may include a seed layer to allow for plating during the formation of the patterned conductive layers 82 and 84; or the patterned conductive layers 82 and 84 are a structure for MIM. The patterned conductive layers 82 and 84 may be processed by a sputter process. The passive component layer 30 may include a plurality of passive components in the region 91 for disposing passive components 30.

Referring to FIG. 5D, a second layer of the insulation layer 40 is disposed on the first layer of the insulation layer 40. Vias 411 and 412 are formed within the insulation layer 40. In some embodiments, the insulation layer 40 includes a suitable insulating material. For example, the insulation layer 40 may be an $SiN_x$ film; however, other suitable materials may be additionally or alternatively used.

Referring to FIG. 5E, a patterned photoresist layer 74 is disposed on a portion of the surface 401 of the insulation layer 40. In some embodiments, the patterned photoresist layer 74 may include, or may be formed from, a positive photoresist. At least a via 70 is formed at the connecting portion region 90. The via 70 penetrates the passive component layer 30 and the surface 101 of the substrate 10. In some embodiments, the via 70 is formed by a sand-blasting technique, rather than a drilling technique. Damage of the relatively thin (e.g., glass) substrate 10 can be avoided during the manufacturing process by replacing the drilling technique with the sand-blasting technique. The substrate 10 includes at least one cutting line. Forming the via 70 further includes forming the via 70 on the at least one cutting line. The patterned photoresist layer 74 is then removed.

Referring to FIG. 5F, a patterned conductive layer 80' is disposed to cover the exposed patterned conductive layer 82. The patterned conductive layer 80' is disposed to cover the sidewall 101s of the substrate 10 and sidewall 401s of the insulation layer 40. The patterned conductive layer 80' also covers a portion of the surface 401 of the insulation layer 40. In some embodiments, the patterned conductive layer 80' may include, for example, Ti—Cu alloy or another suitable metal or metal alloy, or a combination thereof. In some embodiments, the conductive layer 80' is electrically connected to at least one of the plurality of passive components 30. The conductive layer 80' is extended into the via 70 from the passive component layer 30.

Referring to FIG. 5G, a portion of the patterned conductive layer 80' is removed. Another patterned photoresist layer 74 is disposed on regions in which the portion of the patterned conductive layer 80' is removed. In some embodiments, the patterned photoresist layer 74 may include, or may be formed from, a positive photoresist. A thickness of the patterned conductive layer 80' is increased by plating. After plating, the patterned conductive layer 80 is obtained. The patterned conductive layer 80 defines a via 811. The patterned conductive layer 80 may include, for example, Cu, or other metal, or a metal alloy, or other conductive material. The patterned conductive layer 80 covers the top surface 401 the insulation layer 40.

Referring to FIG. 5H, the patterned photoresist layer 74 is removed, for example, by etching. Referring to FIG. 5I, the insulation layer 52 is disposed to cover a portion of the patterned conductive layer 80 and a portion of the top surface 401 of the insulation layer 40. In some embodiments, the insulation layer 52 may be a polypropylene resin; however, other suitable materials may be additionally or alternatively used.

Referring to FIG. 5J, the insulation layer 54 is filled within the via 811. The insulation layer 54 may be an epoxy resin or other insulating materials may be used additionally or alternatively.

Referring to FIG. 5K, the package in FIG. 5J is placed on a carrier 11 in an inverted manner. Next, a portion of the substrate 10, patterned conductive layer 80 and the insulation layer 54 is removed, so as to reduce a thickness of the substrate 10, for example, by backside grinding. The conductive layer 80 is exposed from the surface 102 of the substrate 10.

Referring to FIG. 5L, a patterned photoresist layer 74 is disposed on a portion of the surface 102 of the substrate 10. A support structure 86 is formed or disposed on the insulation layer 54, patterned conductive layer 80, and a portion of the surface 102 of the substrate 10. Next, the insulation layer 54 is formed or disposed on the support structure 86. A seed layer may be disposed to cover the surface 102 of the substrate 10 to allow formation of the support structure 86 by plating, and the seed layer can be considered a portion of the conductive layer 80.

Referring to FIG. 5M, the patterned photoresist layer 74 is removed. Referring to FIG. 5N, the semiconductor device package is separated along the cutting line, for example, by sawing. Next, the semiconductor device package 3 of FIG. 3 is obtained.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Thus, the term "approximately equal" in reference to two values can refer to a ratio of the two values being within a range between and inclusive of 0.9 and 1.1.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

Two surfaces or sides can be deemed to be aligned if a displacement between the two surfaces is no greater than 0.5 μm, no greater than 1 μm, no greater than 5 μm, no greater than 10 μm, or no greater than 15 μm. In the description of some embodiments, a component provided "on" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
    a substrate having a first sidewall, a first surface and a second surface opposite to the first surface;
    a first patterned conductive layer on the first surface of the substrate and having a second sidewall, a first surface and a second surface, wherein the second surface of the first patterned conductive layer is adjacent to the substrate and opposite to the first surface of the first patterned conductive layer;
    a first insulation layer on the first surface of the substrate and having a third sidewall, a first surface and a second surface, wherein the second surface of the first insulation layer is adjacent to the substrate and opposite to the first surface of the first insulation layer; and a second patterned conductive layer extending from the first surface of the first insulation layer to the second surface of the substrate, the second patterned conductive layer being in direct contact with the first surface of the first insulation layer and covering the first, second and third sidewalls.

2. The semiconductor device package of claim 1, wherein the second patterned conductive layer covers the first surface of the first insulation layer, and the second patterned conductive layer covers the second surface of the substrate.

3. The semiconductor device package of claim 2, further comprising a second insulation layer penetrating the first insulation layer, the first patterned conductive layer and the substrate, wherein the second insulation layer covers the second patterned conductive layer, a portion of the first surface of the first insulation layer and a portion of the second surface of the substrate.

4. The semiconductor device package of claim 1, further comprising a passive component layer disposed on the first surface of the substrate and connected to the second patterned conductive layer.

5. The semiconductor device package of claim 1, wherein the substrate comprises a glass material.

6. The semiconductor device package of claim 1, wherein a thickness of the substrate is less than about 300 micrometers (μm).

7. A method for manufacturing a semiconductor device package, comprising:

providing a substrate having a first surface and a second surface opposite to the first surface;

disposing a passive component layer on the first surface of the substrate;

after disposing the passive component layer, forming at least one via in the substrate, wherein the via penetrates the substrate and the passive component layer, and wherein forming the via comprises removing a portion of the passive component layer and a portion of the substrate simultaneously; and disposing a conductive layer on the passive component layer and filling the via with the conductive layer.

8. The method of claim 7, wherein forming the via further comprises forming the via by sand-blasting.

9. The method of claim 7, wherein the conductive layer is exposed from the second surface of the substrate.

10. The method of claim 7, wherein removing the portion of the substrate comprises thinning the substrate.

11. The method of claim 10, further comprising disposing a support structure on the second surface of the substrate.

12. The method of claim 11, wherein disposing the conductive layer comprises disposing the conductive layer on the passive component layer and on a sidewall of the via and disposing the support structure on the second surface of the substrate.

13. A method for manufacturing a semiconductor device package, comprising:

providing a substrate having a first surface and a second surface opposite to the first surface, wherein the substrate includes a connecting portion region and a passive component region;

disposing a passive component layer on the first surface of the substrate at the passive component region, wherein the passive component layer includes a plurality of passive components;

forming at least one via at the connecting portion region, wherein the via penetrates the passive component layer and the first surface of the substrate, and wherein forming the via comprises removing a portion of the passive component layer and a portion of the substrate simultaneously; and disposing a conductive layer on the passive component layer, wherein the conductive layer is electrically connected to at least one of the plurality of passive components, and the conductive layer extends into the via from the passive component layer.

14. The method of claim 13, wherein forming the via further comprises forming the via by sand-blasting.

15. The method of claim 13, wherein the conductive layer is exposed from the second surface of the substrate.

16. The method of claim 13, wherein removing the portion of the substrate comprises thinning the substrate.

17. The method of claim 16, further comprising disposing a support structure on the second surface of the substrate.

18. The method of claim 17, wherein disposing the conductive layer comprises disposing the conductive layer on the passive component layer and on a sidewall of the via, and disposing the support structure on the second surface of the substrate.

* * * * *